United States Patent [19]

Aoki et al.

[11] Patent Number: 4,912,715

[45] Date of Patent: Mar. 27, 1990

[54] SEMICONDUCTOR LASER MODULE INCORPORATING DRIVER CIRCUIT THEREIN

[75] Inventors: Satoshi Aoki, Chigasaki; Tsuyoshi Tanaka, Yokohama, both of Japan

[73] Assignee: Hitachi, Ltd., Tokyo, Japan

[21] Appl. No.: 285,595

[22] Filed: Dec. 16, 1988

[30] Foreign Application Priority Data

Dec. 18, 1987 [JP] Japan .................................. 62-318801

[51] Int. Cl.$^4$ ................................................ H01S 3/02
[52] U.S. Cl. .......................................... 372/36; 372/33; 372/38
[58] Field of Search ............................... 372/36, 38, 33

[56] References Cited

U.S. PATENT DOCUMENTS

| | | | |
|---|---|---|---|
| 4,761,788 | 8/1988 | Dietrich et al. | 372/36 |
| 4,802,178 | 1/1989 | Ury | 372/36 |
| 4,837,768 | 6/1989 | Schmid | 372/36 |

FOREIGN PATENT DOCUMENTS

| | | |
|---|---|---|
| 5368588 | 6/1978 | Japan . |
| 5370689 | 6/1978 | Japan . |
| 58119690 | 7/1983 | Japan . |
| 62112389 | 11/1985 | Japan . |

OTHER PUBLICATIONS

IEEE Journal of Lightwave Technology, vol. LT-2, (1984/8), page 398.

Primary Examiner—James W. Davie
Attorney, Agent, or Firm—Antonelli, Terry & Wands

[57] ABSTRACT

In a semiconductor laser module incorporating a driving circuit therein, which contains a semiconductor laser mounted on an electronic cooling element and a semiconductor laser driving IC within the same package, is provided an electrode lead on a stem for mounting a semiconductor laser, for connecting the semiconductor laser with a board carrying a driving IC and the dimensions of the electrode lead are defined so as to reduce the stray capacitance and the parasitic inductance and to optimize the thermal resistance. A gap of a value not to introduce an increase of an unnecessary inductance between the semiconductor laser mounting portion and the driver IC mounting board is provided to spatially divide the semiconductor laser mounting portion and the driver IC mounting board. Thereby, the inflow of the heat generated in a driver IC into a semiconductor laser mounted on an electronic cooling element can be suppressed without degrading the high speed modulation characteristics in the giga-bits band.

2 Claims, 1 Drawing Sheet

SEMICONDUCTOR LASER MODULE INCORPORATING DRIVER CIRCUIT THEREIN

BACKGROUND OF THE INVENTION

This invention relates to optical communication and more particularly to a semiconductor laser module incorporating a driver circuit therein, adapted for use as a light transmitter for a high speed transmission system of the giga-bits band.

The conventional semiconductor laser modules incorporating a driver circuit therein for use in medium speed light transmission of several hundreds Mb/sec or below are described in IEEE, journal of Lightwave Technology, LT-2, No. 4 (1984) p. 398. As disclosed in this article, the connection between a semiconductor laser and an IC mounting board mounting a semiconductor laser driving IC is done by wire-bondings. The inductance of a wire used for wire-bonding is, for example in the case of using a Au wire of 25 μm diameter, about 1 nH per 1 mm length. In the above-mentioned conventional art, four wires are used in parallel in order to reduce the inductance and suppress the deterioration of the modulation performance.

When a wire or wires of wire-bonding are used for the connection between the semiconductor laser and the driver IC, since the thermal resistance of the wire is high, the flow of heat generated in the driver IC into the semiconductor laser can be suppressed to a low flow. But, the inductance becomes a problem. In the prior art, the inductance is reduced by increasing the number of wires. When applied in a high speed transmission system of several hundreds Mb/sec or above and particularly the ultra-high speed transmission system of the giga-bits band, the mutual inductance among a plurality of wires and the parasitic reactance such as stray capacitance become problems and may form factors for causing deterioration of the modulation characteristics. Also, the dispersion in the wire length arising from the dispersion in the wire-bonding process also causes dispersion in the performance of the module.

The above-mentioned prior art does not take the points of the stray capacitance, the parasitic inductance, and the dispersion in the performance which become problems in the high speed transmission system and more particularly in the giga-bits band, into consideration and has problems in the high speed modulation action in the giga-bits band. Reference may be made to Nos. JP-A-62-112389, JP-A-58-119690, JP-A-5370689 and JP-A-53-68588.

SUMMARY OF THE INVENTION

An object of this invention is to provide a semiconductor laser module incorporating a driver circuit therein, which is capable of the high speed modulation action in the giga-bits band, has small dispersion in the performance characteristics and suppresses the transfer of heat generated in the driving IC into the semiconductor laser.

The above object can be achieved by providing an electrode lead on a stem for mounting a semiconductor laser, for connecting the semiconductor laser with a board carrying a driving IC and defining the dimensions of the electrode lead so as to reduce the stray capacitance and the parasitic inductance and to optimize the thermal resistance, and by providing a gap of a value not to introduce an increase of an unnecessary inductance between the semiconductor laser mounting portion and the driver IC mounting board so as to spatially divide the semiconductor laser mounting portion and the driver IC mounting board.

DESCRIPTION OF THE PREFERRED EMBODIMENTS

Figure 1:
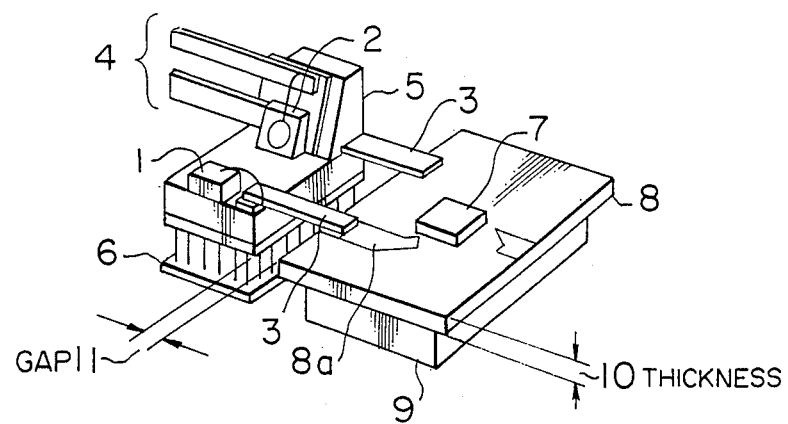
FIG. 1 is a perspective view of the inside of a package of an embodiment of this invention.

The inductance of an electrode lead is determined by its width, thickness or diameter and the number of parallel conductors. The inductance can be reduced by increasing these parameters. The thermal or heat resistance, however, is reduced with reduction in the inductance. Thus, the amount of incoming heat will increase.

The required inductance can be determined from the relation with the capacitance which is determined by the dielectric constant of the IC mounting board, the thickness of the board, the pattern configuration on the board etc. selected to achieve rise and fall times which satisfy the required transmission speed. Also, the required heat resistance is determined from the temperature of the semiconductor laser mounting portion cooled by an electronic cooling element, the amount of heat absorbed by the electronic cooling element, the heat generation and the temperature of the driver IC, the heat dissipation route of the IC and the heat resistance thereof. By determining the dimensions and the shape of the electrode lead to have appropriate inductance and heat resistance from the above relations, the required inductance can be held while the heat conduction through the electrode lead can be suppressed.

Since the semiconductor laser mounting portion cooled by the electronic cooling element and the driver IC mounting board have a large temperature difference, they should be isolated to suppress the heat transfer. Formation of a gap between the semiconductor laser mounting portion and the driver IC mounting board to spatially divide these two can provide the largest heat insulation or adiabatic effect. This effect increases as the gap is increased. As the gap is increased, however, the length of the electrode lead becomes longer and the inductance is increased. Therefore, the dimension of the spatially dividing gap is determined within a range which can keep the required inductance. Thereby, the heat transfer from the driver IC mounting board to the semiconductor laser mounting portion through the atmosphere within the package can be suppressed. As stated above, by optimizing the inductance and incoming heat accompanied with a reduction in the heat resistance, which are in a contradicting relation, unnecessary heat flow into the semiconductor laser mounting portion can be suppressed without degrading the high speed modulation characteristics. Therefore, the temperature rise of the semiconductor laser can be reduced to suppress the service life shortening, the loss of stability of the characteristics. Also, since the dispersion in the inductance due to the dispersion in the machining precision for the shape and the dimensions of the electrode lead is smaller than that due to the dispersion in the wire length of the wire-bonding, the dispersion in the characteristics can be reduced. Thus, it is effective to improve the quality.

An embodiment of this invention will be described hereinbelow, referring to FIG. 1. A semiconductor laser 1 is mounted on a stem 5 together with a photo-diode 2 for monitoring the light output. This stem 5 is provided with electrode leads 3 electrically connected to the semiconductor laser 1, and electrode leads 4 electrically connected to the photo-diode 2 for monitoring the light output. The stem 5 is mounted on an electronic cooling element 6 together with a temperature detecting thermister (not shown). On the other hand, a GaAs IC 7 for driving the semiconductor laser is mounted on an alumina board 8. The alumina board 8 is packaged on a heat sink 9 and housed in a same package as that housing 1–6.

As the semiconductor laser 1, a distribution feed-back type laser made of GaInAsP was used. The driver IC 7 is a GaAs IC of current switch construction and is capable of modulating action in the 2 Gb/sec band. The required inductance of the electrode leads 3 can be obtained by subtracting the inductance of the wire connecting the driver IC and the alumina board 8, etc. from the inductance allowed for the whole signal path for enabling the 2 Gb/sec operation considering the capacitance determined by the thickness 10 of the alumina board or substrate 8 and the shape of the pattern 8a on the board 8.

The semiconductor laser is temperature-controlled at 25° C. by the electronic cooling element 6. The larger part of the heat generated by the driver IC 7 is dissipated to the outside through the heat sink 9 of a small heat resistance. As the ambient temperature outside the package rises, a temperature difference can occur between the stem which is temperature-controlled at 25° C. constant and the alumina board 8. Then, the quantity of heat transfer through the electrode leads 3 increases. When the amount of incoming heat exceeds the amount of heat absorbed by the electronic cooling element 6, the temperature of the stem 5, and hence the temperature of the semiconductor laser 1 cannot be held at 25° C. and a temperature rise of laser 1 occurs. For suppressing the above-mentioned phenomenon, the heat resistance of the electrode leads 3 and the gap 11 between the stem 5 and the alumina board 8 are determined to satisfy the required inductance of the electrode leads 3, the width and the thickness of the electrode leads 3 are set at the dimensions equal to or below the thickness 10 of the alumina board 8, and the gap 11 is set equal to or above the thickness 10 of the board 8. As the result, it was found that the temperature of the semiconductor laser 1 can be kept constant at 25° C. even when the ambient temperature outside the package, i.e. the operation temperature is raised to 70° C., and that there is no problem in the high speed modulation operation at 2 Gb/sec from the observation of the modulation light output waveform of the semiconductor laser 1.

Figure 2:
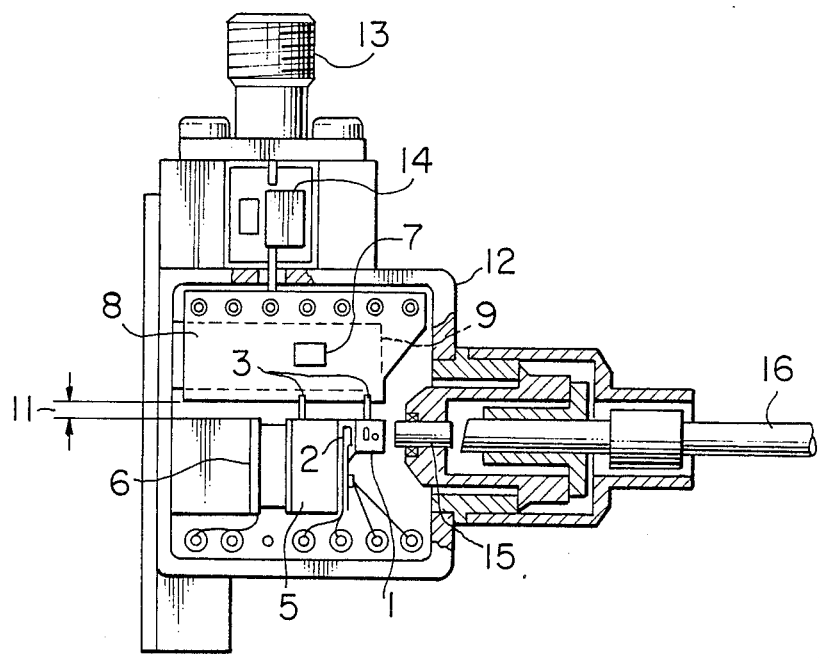
FIG. 2 is a plan view showing the whole body of another embodiment of this invention.

FIG. 2 shows an embodiment of a semiconductor laser module incorporating a driving circuit according to this invention.

In FIG. 2, the position of the electronic cooling element 6 is different from that of FIG. 1, which, however, is not important. A semiconductor laser 1 is mounted on a stem 5 together with a monitoring photo-diode 2, and is temperature-controlled by an electronic cooling element 6. A GaAs IC 7 for driving the semiconductor laser is mounted on an alumina board 8 and packaged on a heat sink 9. The high frequency signal is inputted through a co-axial high frequency connector 13 provided in the package 12, and is led to the driver IC 7 through an AC coupling capacitance 14. The output of the driver IC 7 is inputted to the semiconductor laser 1 from the pattern 8a on the alumina board 8 through the electrode leads 3 provided on the stem 5. Here, the gap 11 between the alumina board 8 and the stem 5 is selected to be equal to or larger than the board thickness 10 of the alumina board 8 to spatially divide the alumina board 8 and the stem 5. Also, the width and the thickness of the electrode lead are set equal to or smaller than the board thickness 10 of the alumina board 8.

The light emitted from the semiconductor laser 1 is coupled to an optical fiber 16 through a coupling optical system 15 comprising two lenses.

In the embodiment shown in FIG. 2, an AC coupling capacitor was shown in the path of the input signal. It is also possible to employ DC coupling. Also, although a system including two lenses was shown as the coupling optical system, any optical system having a similar function may be employed.

According to this invention, the inflow of the heat generated in a driver IC into a semiconductor laser mounted on an electronic cooling element can be suppressed without degrading the high speed modulation characteristics in the giga-bits band. Therefore, the semiconductor laser can be controlled at a constant temperature within a wide temperature range. Thus, reductions in the service life shortening of the semiconductor laser, variation of the characteristics of the laser, power dissipation of the electronic cooling element, and the dispersion of the modulation characteristics can be made, thereby improving the quality and the reliability.

What is claimed is:

1. A semiconductor laser incorporating a driver circuit therein, comprising:
    (a) a semiconductor laser;
    (b) a semiconductor laser mounting member for mounting said semiconductor laser;
    (c) an electronic cooling element for mounting said semiconductor laser mounting member;
    (d) an electrode lead having one end connected to said semiconductor laser mounting member and electrically connected to said semiconductor laser;
    (e) a driver IC for driving said semiconductor laser; and
    (f) a board mounting said driver IC and connecting the other end of said electrode lead,
    wherein a gap not smaller than the thickness of said board is formed between said semiconductor laser mounting member and said board, said gap being a certain dimension within a range which provides a required inductance, said required inductance being such a value that said required inductance and a capacitance together produce a required signal transmission speed, said capacitance being determined from at least a dielectric constant of said board, a thickness of said board and a pattern configuration of said board.

2. A semiconductor laser module according to claim 1 wherein the width and the thickness of said electrode lead are set not larger than the thickness of said board.

* * * * *